(12) United States Patent
Ayano et al.

(10) Patent No.: US 8,829,838 B2
(45) Date of Patent: Sep. 9, 2014

(54) POWER CONVERTER

(75) Inventors: Hideki Ayano, Hachioji (JP); Katsumi Ishikawa, Hitachinaka (JP); Kazutoshi Ogawa, Hitachi (JP); Tsutomu Kominami, Hitachinaka (JP); Mami Kunihiro, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 128 days.

(21) Appl. No.: 13/580,281

(22) PCT Filed: Mar. 10, 2010

(86) PCT No.: PCT/JP2010/001677
§ 371 (c)(1),
(2), (4) Date: Aug. 21, 2012

(87) PCT Pub. No.: WO2011/111097
PCT Pub. Date: Sep. 15, 2011

(65) Prior Publication Data
US 2013/0015799 A1 Jan. 17, 2013

(51) Int. Cl.
*H02P 3/00* (2006.01)
*H02P 23/00* (2006.01)
*B60L 3/00* (2006.01)
*B60L 3/12* (2006.01)
*B60L 7/26* (2006.01)
*B60L 11/18* (2006.01)
*B60L 15/20* (2006.01)
*B60L 7/14* (2006.01)

(52) U.S. Cl.
CPC .......... *B60L 3/003* (2013.01); *B60L 2240/423* (2013.01); *B60L 2240/421* (2013.01); *B60L 2240/36* (2013.01); *B60L 2250/16* (2013.01); *B60L 3/12* (2013.01); *B60L 7/26* (2013.01); *B60L 11/1857* (2013.01); *B60L 15/2009* (2013.01); *B60L 7/14* (2013.01); *Y02T 10/642* (2013.01); *Y02T 10/7005* (2013.01); *Y02T 10/70* (2013.01); *Y02T 10/705* (2013.01)
USPC ............................ 318/471; 318/478; 318/490

(58) Field of Classification Search
USPC ........... 318/40, 159, 430, 436, 456, 471–473, 318/476, 478–479, 488, 490
See application file for complete search history.

(56) References Cited

U.S. PATENT DOCUMENTS 7,414,376 B2 * 8/2008 Sasaki et al. .................. 318/375
7,904,254 B2   3/2011 Ibori et al.

FOREIGN PATENT DOCUMENTS

| JP | 2003-9541 A | 1/2003 |
| JP | 2008-271703 A | 11/2008 |
| JP | 2009-225541 A | 10/2009 |

OTHER PUBLICATIONS

Corresponding International Search Report with English Translation dated Jun. 15, 2010 (three (3) pages).

*Primary Examiner* — Bentsu Ro
(74) *Attorney, Agent, or Firm* — Crowell & Moring LLP

(57) ABSTRACT

The present invention provides a power converter which, while ensuring safety, implements control for the flow of a constant current in a specified switching element, more accurately determines the lifetime of a switching element, and reduces the number of temperature detectors. The power converter is provided with a mechanism which causes a brake device to operate or which confirms that a brake mechanism is operating. The power converter supplies current to the d-axis and the q-axis of a rotational coordinate system, within the range of the braking torque of the brake mechanism, and passes the desired current to the desired element. Furthermore, temperature detectors are attached only in chips in sections where a crack readily develops in the upper solder layer or peeling is readily generated in the wire bonding, and in chips where a crack readily develops in the lower solder layer.

20 Claims, 10 Drawing Sheets

FIG. 11
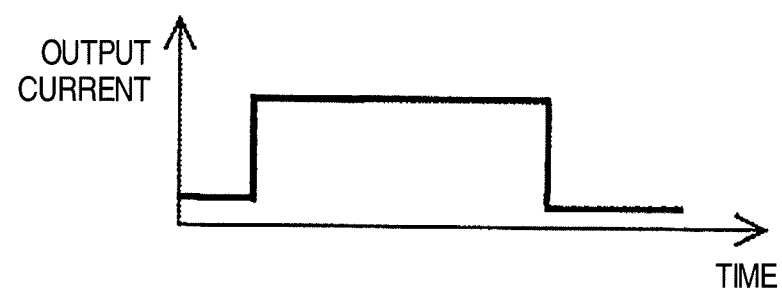
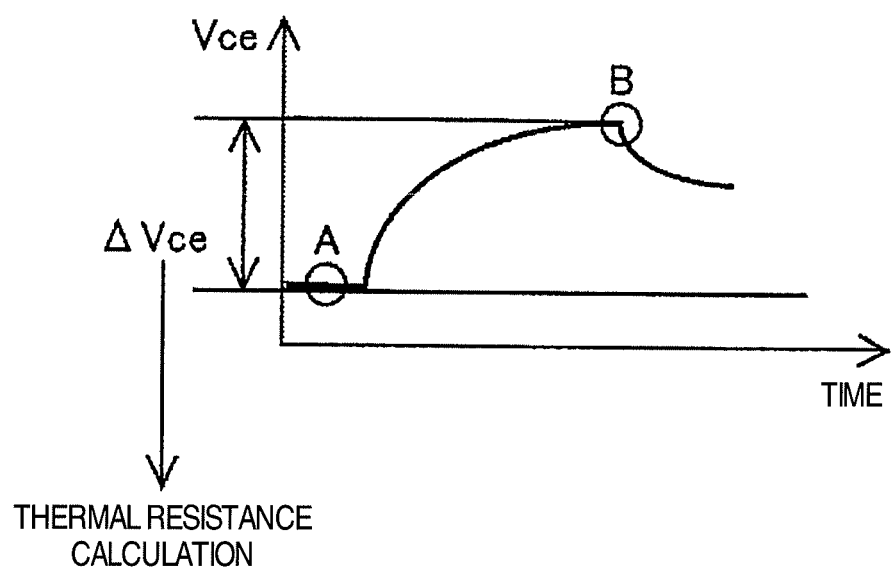
THERMAL RESISTANCE
CALCULATION

POWER CONVERTER

TECHNICAL FIELD

The present invention relates to a power converter, and more particularly to a power converter that motor drives a moving body.

BACKGROUND ART

The power converter described in Patent Literature 1 drives the power transistor so that a predetermined value of current is supplied to the motor for a predetermined period of time before driving a vehicle in order to determine the lifetime of the power semiconductor device of the power converter mounted on a hybrid vehicle. In addition, the power converter calculates the thermal resistance value of the power transistor and, based on the calculated thermal resistance value, determines the lifetime.

CITATION LIST

PATENT LITERATURE 1: JP-A-2003-9541

SUMMARY OF INVENTION

Technical Problem

However, according to the description in Patent Literature 1, because the lifetime is determined by supplying current (d-axis current), which does not generate torque, as the current command, a measurable switching element varies according to the magnetic pole position of the motor and, therefore, it is difficult to supply a constant current to a particular switching element. In addition, because the state of the magnetic pole position is indeterminate, some switching elements can hardly be evaluated depending upon the condition. It is also described that current is supplied to an element in the fixed coordinate system (UVW phase), selected by the magnetic pole position, using a command composed only of the d-axis in the rotational coordinate system. However, it is difficult to constantly supply a constant value of current under the condition in which the state of the magnetic pole position is indeterminate, sometimes with a result that an error in evaluation determination will become serious. In addition, a temperature detector must be installed on all switching elements to allow a measurable switching element to be selected according to the magnetic pole position, this configuration generates the problem that the cost will increase and that the device installation will become more complex.

It is an object of the present invention to provide a power converter that performs control so that a constant current is supplied to a particular switching element while ensuring safety, determines the lifetime of a switching element more accurately, and reduces the number of temperature detectors.

Solution to Problem

To achieve the problems described above, the present invention is characterized in that a power converter comprises an inverter main circuit; a motor driven by the inverter main circuit; a brake device that puts brake on the motor; a control circuit that calculates a command value for driving the inverter main circuit; a mechanism that causes the brake device to operate or confirms that the brake device is in operation; and a temperature detector that detects a temperature of a switching element mounted in the inverter main circuit wherein, with the brake device in operation, a command for supplying a predetermined current to a particular phase is given from the control circuit to the inverter main circuit, a current is supplied from the inverter main circuit to the motor, and a lifetime of the switching element is evaluated based on temperature information detected by the temperature detector.

In addition, the present invention provides the power converter characterized in that the predetermined current supplied to a particular phase with the control device in operation is a current in which a field system current component and a torque current component are mixed and in that a torque generated by the motor using the mixed current is smaller than a braking torque of the brake device.

In addition, the present invention provides the power converter characterized in that the temperature detector is composed of two chips, one is a chip in the center and the other is a chip on an outermost periphery, in modules configuring the inverter main circuit.

In addition, the present invention provides the power converter characterized in that the phase to which the predetermined current is supplied is a phase that includes a chip where the temperature detector detects temperature and in that an amount of the predetermined current is a constant value for all phases.

In addition, the present invention provides the power converter characterized in that an element module configuring the inverter main circuit is a six-in-one mode module in which all switching elements of three phases of the inverter are mounted and in that an operation of the power converter is controlled so that almost equal losses are generated in the phases in a steady state.

In addition, the present invention provides the power converter characterized in that, if a detected temperature value or temperature rise value becomes larger by at least a predetermined amount as compared with normal-time history or exceeds a predefined reference temperature value or reference temperature rise value, information is displayed on a display device or notified to a management center.

In addition, the present invention provides the power converter characterized in that, if a detected temperature value or temperature rise value becomes larger by at least a predetermined amount as compared with normal-time history or exceeds a predefined reference temperature value or reference temperature rise value, an output power of the inverter main circuit is limited.

In addition, the present invention provides the power converter characterized in that a lifetime evaluation of the switching element is performed before a moving body is operated, or in a stopped state after a predetermined operation is performed, or at a predetermined time.

To achieve the problems described above, the present invention is characterized in that a power converter comprises an inverter main circuit; a motor driven by the inverter main circuit; a brake device that puts brake on the motor; a control circuit that calculates a command value for driving the inverter main circuit; a mechanism that causes the brake device to operate or confirms that the brake device is in operation; and a voltage detector provided between terminals of switching elements mounted in the inverter main circuit wherein, with the brake device in operation, a command for supplying a predetermined current to a phase, to which the voltage detector is connected, is given from the control circuit to the inverter main circuit, a current is supplied from the inverter main circuit to the motor, and a lifetime of the switching element is evaluated based on voltage information detected by the voltage detector.

In addition, the present invention provides the power converter characterized in that the predetermined current supplied to a particular phase with the control device in operation is a current in which a field system current component and a torque current component are mixed and in that a torque generated by the motor using the mixed current is smaller than a braking torque of the brake device.

In addition, the present invention provides the power converter characterized in that the predetermined current supplied to a particular phase with the control device in operation is a current in which a field system current component and a torque current component are mixed and in that a torque generated by the motor using the mixed current is smaller than a braking torque of the brake device.

In addition, the present invention provides the power converter characterized in that a thermal resistance value is calculated using a voltage detected by the voltage detector and, if the calculated thermal resistance value becomes larger by at least a predetermined amount as compared with normal-time history or exceeds a predefined reference thermal resistance value, information is displayed on a display device or notified to a management center.

In addition, the present invention provides the power converter characterized in that a thermal resistance value is calculated using a voltage detected by the voltage detector and, if the calculated thermal resistance value becomes larger by at least a predetermined amount as compared with normal-time history or exceeds a predefined reference thermal resistance value, an output power of the inverter main circuit is limited.

In addition, the present invention provides the power converter characterized in that a lifetime evaluation of the switching element is performed before a moving body is operated, or in a stopped state after a predetermined operation is performed, or at a predetermined time.

Advantageous Effects of Invention

The present invention provides a power converter that performs control so that a constant current is supplied to a particular switching element while ensuring safety, determines the lifetime of a switching element more accurately, and reduces the number of temperature detectors.

BRIEF DESCRIPTION OF DRAWINGS

FIG. 11 is a diagram showing an example of lifetime determination in the second embodiment.

DESCRIPTION OF EMBODIMENTS

Embodiments of the present invention are described below with reference to the drawings.

First Embodiment

Figure 1:
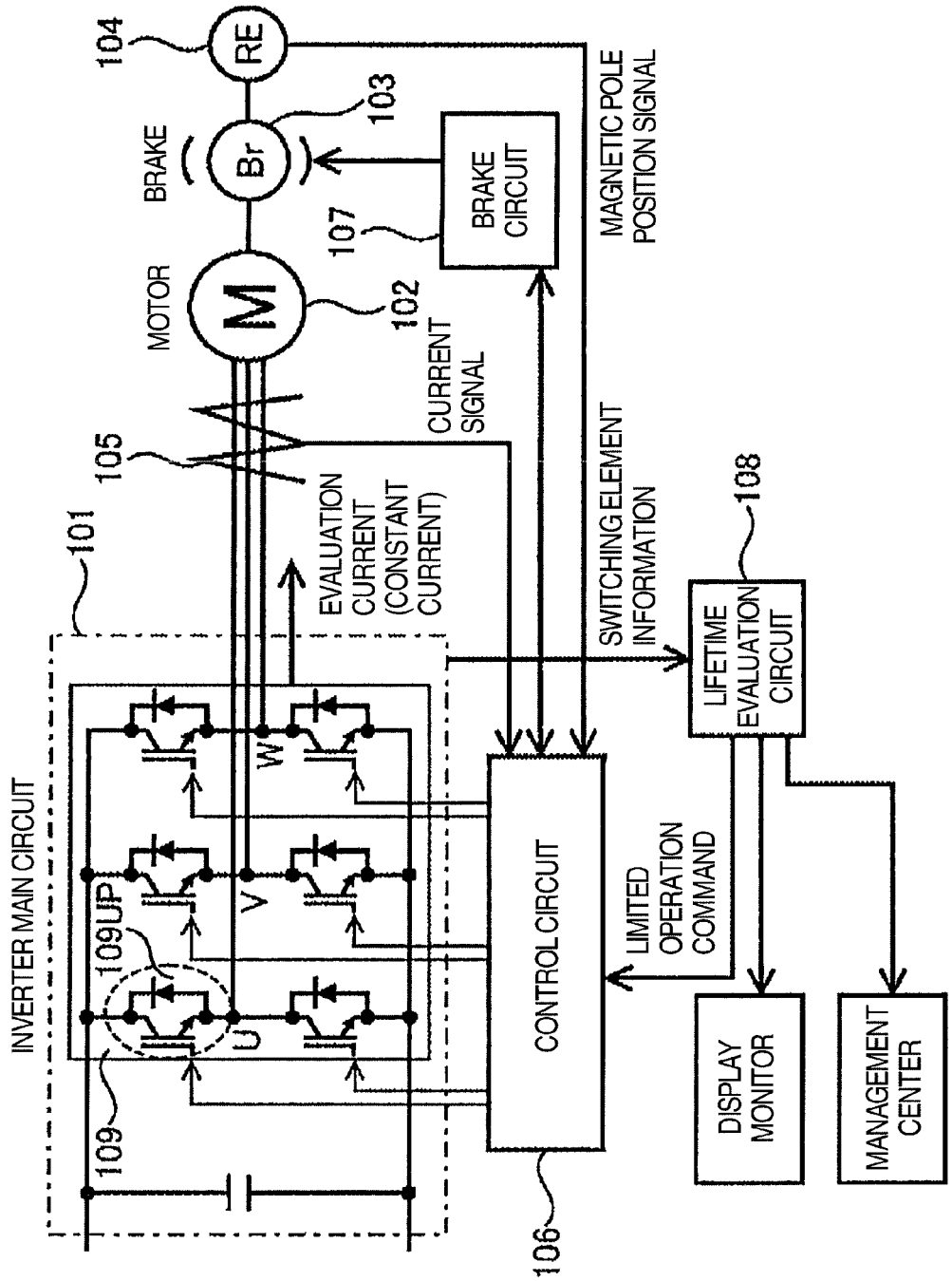
FIG. 1 is a configuration diagram showing a first embodiment of the present invention.

FIG. 1 is a diagram showing a power converter in a first embodiment of the present invention. The power converter comprises an inverter main circuit 101, a motor 102 driven by the inverter main circuit 101, a brake device 103 for putting brake on the motor 102, a rotary encoder 104 that detects the magnetic pole position and the rotational speed of the motor 102, a current detector 105 that detects the current outputting from the inverter main circuit 101 to the motor 102, a control circuit 106 that carries out operation for controlling the inverter main circuit 101 using the magnetic pole position signal received from the rotary encoder 104 and the current signal received from the current detector 105, a brake circuit 107 that activates/deactivates the brake device 103, and a lifetime evaluation circuit 108 that evaluates the lifetime of a switching element based on the switching element information output from the inverter main circuit 101. The inverter main circuit 101 uses an element module 109. In the first embodiment, the inverter main circuit 101 uses the so-called six-in-one module in which the six switching elements, corresponding to the three phases (UVW phases) of the output, are mounted in one module.

Figure 2:
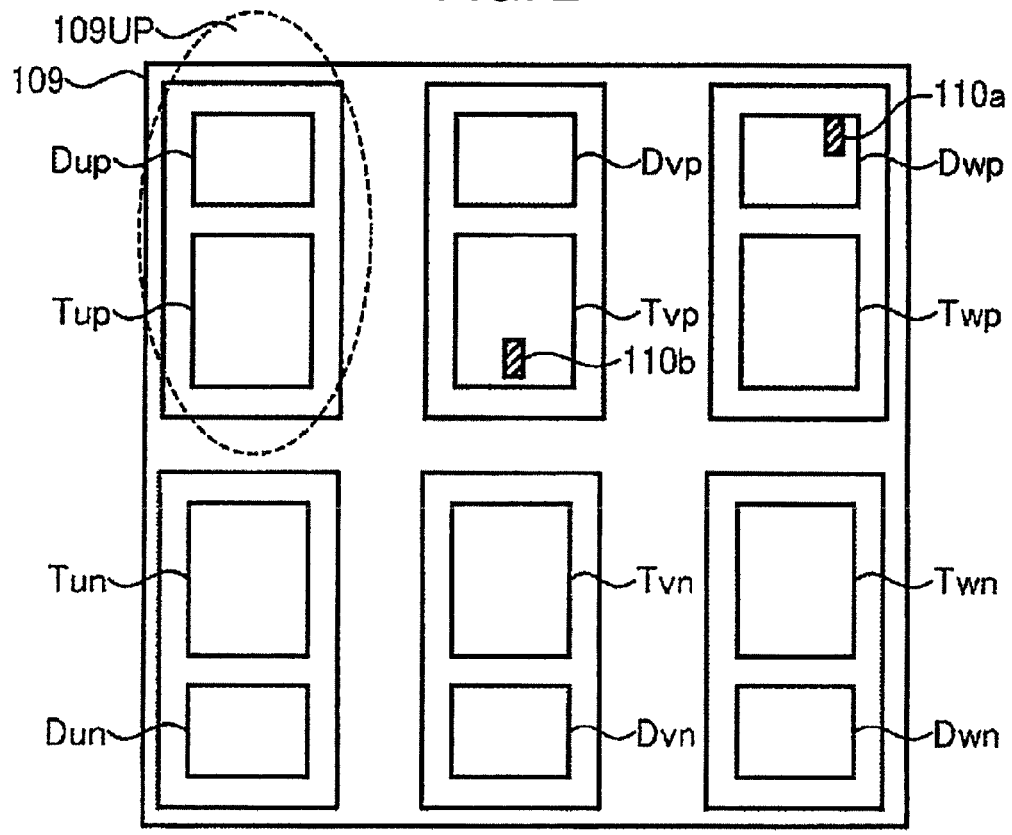
FIG. 2 is a diagram showing an example of the chip arrangement in an element module in the first embodiment.

FIG. 2 is a diagram showing an example of the chip arrangement in the element module 109 shown in FIG. 1. Each phase of the inverter main circuit has the configuration in which the switching elements, each composed of the switch part, such as an IGBT, transistor, and MOS-FET, and the diode part, are connected in series. For example, a U-phase positive pole side switching element 109UP shown in FIG. 1 is configured by a substrate, on which the switch part chip Tup and the diode part chip Dup are mounted, as shown by the dotted line in FIG. 2. This substrate and the similarly configured U-phase negative pole side substrate, on which the switch part chip Tun and the diode part chip Dun are mounted, are electrically connected in series. Similarly, the V-phase positive pole side substrate, on which the switch part chip Tvp and the diode part chip Dvp are mounted, and the V-phase negative pole side substrate, on which the switch part chip Tvn and the diode part chip Dvn are mounted, are connected in series. Also, the W-phase positive pole side substrate, on which the switch part chip Twp and the diode part chip Dwp are mounted, and V-phase negative pole side substrate, on which the switch part chip Twn and the diode part chip Dwn are mounted, are connected in series. FIG. 2 shows an example of the configuration in which the U phase is arranged on the left side, the V phase in the center, and W phase on the right side.

Figure 3:
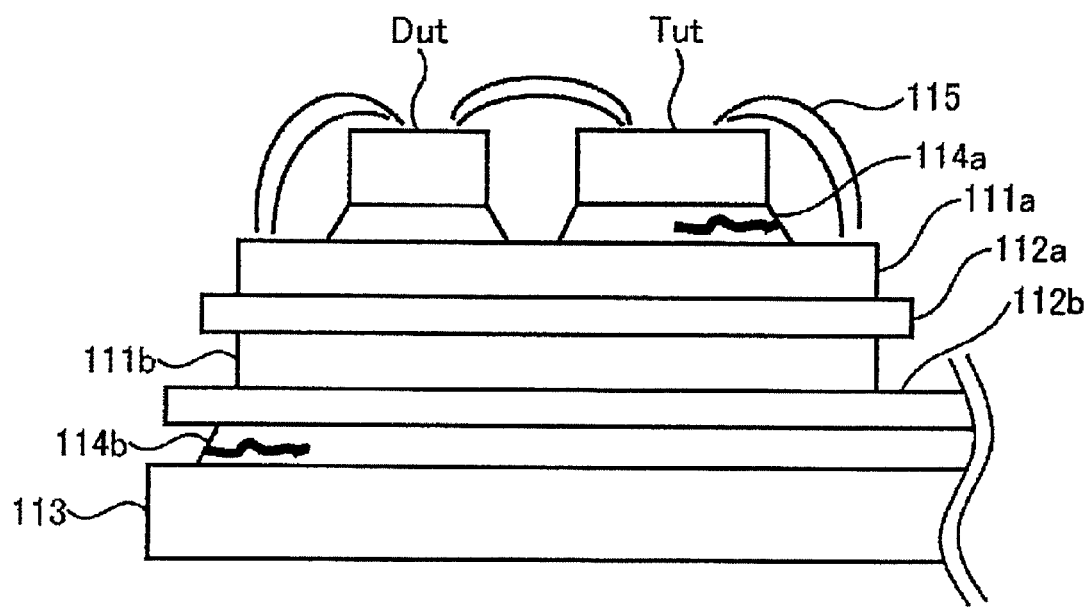
FIG. 3 is a cross sectional diagram of the dotted part in FIG. 2.

FIG. 3 shows an example of the cross section of the dotted-line part in FIG. 2 (substrate part on which the switch part chip Tup and the diode part chip Dup are mounted). In this example, a metal pattern 111a is connected below the switch part chip Tup and the diode part chip Dup via an upper solder layer 114a. In addition, the laminated structure is built in which the metal pattern 111a is connected to a metal pattern 111b via an insulating substrate 112a and the metal pattern 111b is connected to a metal base plate 113 via an insulating substrate 112b, which connects to all substrates, and an lower solder layer 114b. In addition, the switch part chip Tup and the diode part chip Dup are connected to the metal pattern by a metal conducting wire 115.

The switching element is deteriorated in most cases when a crack develops in the lower solder layer 114b as shown in FIG. 3. This crack develops when the temperature is changed as the inverter is started and stopped repeatedly and, as a result, stress is generated between the metal base plate 113 and the lower solder layer 114b because of a difference in the coefficient of thermal expansion between the metals. Similarly, due to a change in the temperature on the chip, a crack develops as shown in the upper solder layer 114a in FIG. 3 or peeling occurs on the metal conducting wire 115. This crack or the peeling deteriorates the radiation efficiency and further increases the temperature change, leading to chip destruction.

Figure 4:
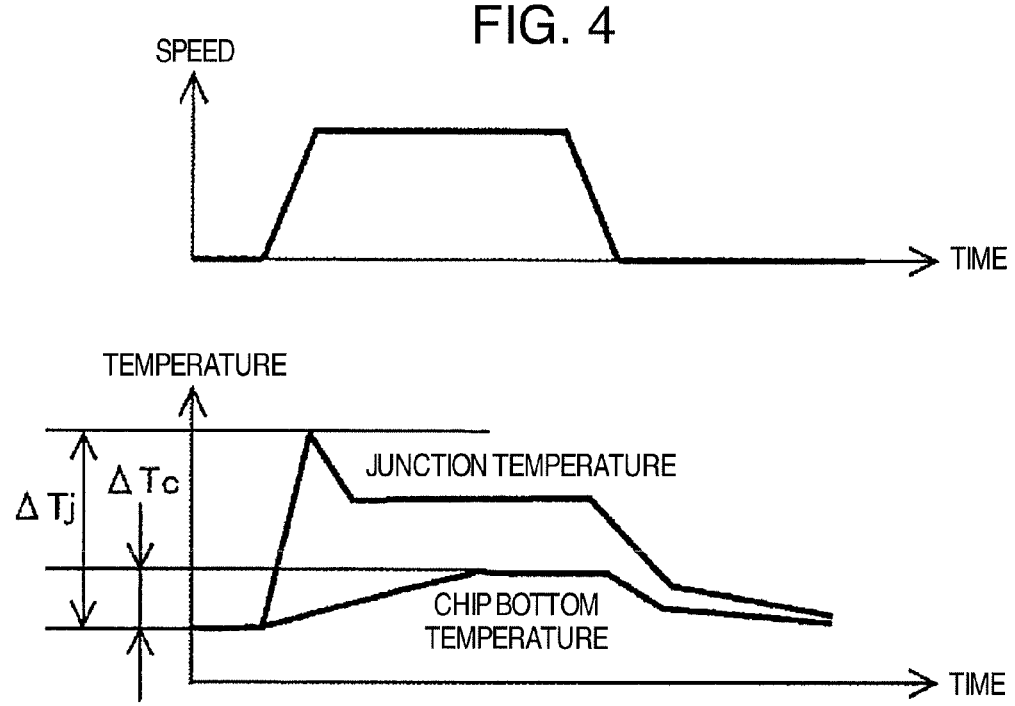
FIG. 4 is a diagram showing an example of the junction temperature and the chip bottom temperature with respect to a speed command.
Figure 5:
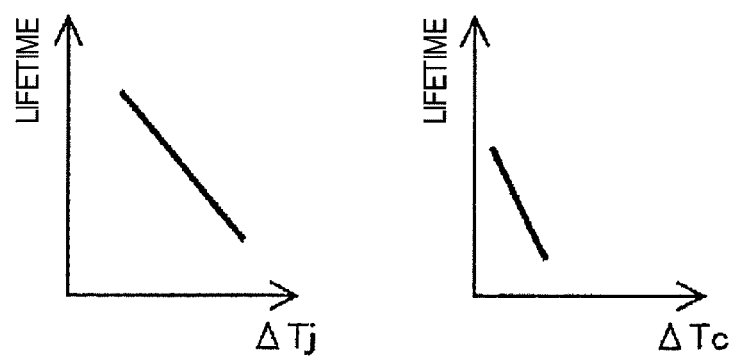
FIG. 5 is a diagram showing an example of the cycle lifetime characteristics of a semiconductor device.

FIG. 4 shows an example of the junction temperature and the chip bottom temperature with respect to the speed command. Here, the junction temperature refers to the temperature of a chip, and the chip bottom temperature refers to the temperature of the metal base plate 113 directly under the chip. Because the time constant of the junction temperature for a heat change is small, the temperature increases in an acceleration area where the speed increases (area where the output torque is high and a relatively large current flows) and the temperature decreases in a constant-speed area and a deceleration area. On the other hand, because the bottom of a chip is connected to a radiation part such as a heat sink that has a large heat capacity, the thermal time constant of the chip bottom temperature is large and the temperature gradually increases during the operation. A large time constant indicates that the temperature gradually increases and that the temperature gradually decreases when the operation is stopped. Therefore, when the operation is started and then stopped frequently and continuously, the chip bottom temperature starts increasing before the temperature decreases to the initial temperature at a stopped time, meaning that the temperature increases over time. In addition, this increased temperature is added to the junction temperature with the result that the peak value of the junction temperature is increased. In general, the change $\Delta Tj$ in the junction temperature affects a crack in the upper solder layer 114a and a peeling of the metal conducting wire, and the change $\Delta Tc$ in the chip bottom temperature affects the lower solder layer 114b. FIG. 5 is a diagram showing an example of the cycle life characteristics of a semiconductor device. The lifetime of a switching element is shortened inversely proportional to the change $\Delta Tj$ in the junction temperature and the change $\Delta Tc$ in the chip bottom temperature.

When considering a crack in the lower solder layer 114b, the crack tends to propagate from the periphery to the center of the lower solder layer 114b because of the stress-strain relation. Therefore, the radiation efficiency is decreased beginning with the chips near the periphery (corresponding to Dup, Dun, Dwp, and Dwn in the example in FIG. 2), with the temperature largely increased in those chips. On the other hand, when considering a crack in the upper solder layer 114a and a peeling of the metal conducting wire 115, the crack and the peeling are generated more easily in the chips in the center. This is because, though a heat loss generally occurs evenly in the phases of the inverter main circuit, the temperature of the central part of the metal base plate 113 becomes highest in the chip arrangement shown in FIG. 2 because the central part is affected by thermal interference caused by the heat generation in the other phases. As a result, a crack in the upper solder layer 114a and a peeling of the metal conducting wire 115 are conspicuous in the chips in the center (corresponds to Tvp and Tvn in the example in FIG. 2). When a crack develops in the upper solder layer 114a, the radiation efficiency is decreased, as in the lower solder layer 114b, with the temperature increased in the corresponding chips. The peeling of the metal conducting wire 115 also increases the resistance and therefore increases the temperature of the corresponding chips. Therefore, temperature detectors 110a and 110b, such as a temperature-detecting diode or a thermocouple, are connected only to the chips in the center and the chips in the outmost chips as shown in FIG. 2 for evaluating the temperature. Connecting the temperature detectors in this way makes it possible to detect the most conspicuous part of the deterioration in the lower solder layer 114b and the most conspicuous part of the deterioration and most-peeled-off part of the metal conducting wire 115 in the upper solder layer 114a.

Figure 6:
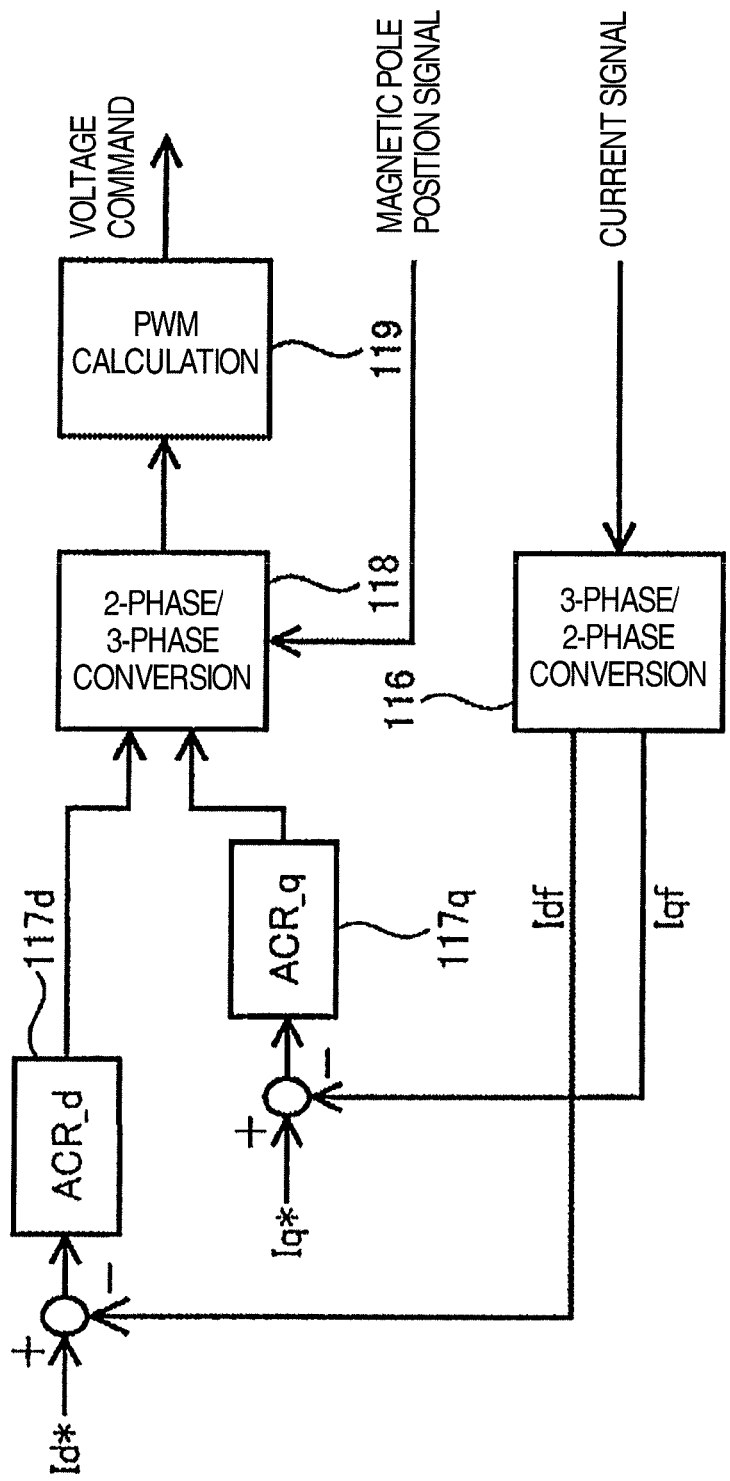
FIG. 6 is a block diagram showing the main circuit inverter control in the first embodiment.

Next, the following describes the control of the inverter main circuit 101 in the first embodiment. FIG. 6 is a block diagram showing the control of the main circuit inverter in the first embodiment. In FIG. 6, the current signal of each phase (u, v, w phase) in the fixed coordinate system, obtained from a current detector 5, is converted to the signal (Idf, Iqf) in the rotational coordinate system (dq phase) by a 3-phase/2-phase conversion unit 116. The d-axis and the q-axis in the rotational coordinate system cross at right angles and, in general, the d-axis is an axis for motor field-system components, and the q-axis is an axis for motor torque components. That is, in controlling the motor 102, the coordinate system is converted to the rotational coordinate system to allow the field system and the torque to be controlled independently. The difference between the signal (Idf, Iqf) in the rotational coordinate system described above and the current command value (Id*, Iq*) is input to a d-axis current control system 117d and the q-axis current control system 117q respectively to make the signal (Idf, Iqf) follow the current command value (Id*, Iq*). In addition, the output result (voltage command in the rotational coordinate system) is input to a 2-phase/3-phase conversion unit 118 to convert the value to a value in the fixed coordinate system. The converted value is then input to a pulse width modulation conversion unit 119 that outputs the voltage command of each element of the inverter main circuit 101.

To perform the temperature evaluation accurately, it is necessary to constantly supply a constant current to a particular switching element for evaluation. That is, it is important to decide how to determine the current command value (Id*, Iq*) in the rotational coordinate system for supplying a constant current to the semiconductor switch of a particular phase in the fixed coordinate system. The relational expression of the rotational coordinate system and the fixed coordinate system is shown in [Expression 1].

[MATH. 1]

[Expression 1]

$$\begin{bmatrix} Id \\ iq \end{bmatrix} = \frac{2}{3} \begin{bmatrix} \cos\theta & -\frac{1}{2}\cos\theta + \frac{\sqrt{3}}{2}\sin\theta & -\frac{1}{2}\cos\theta - \frac{\sqrt{3}}{2}\sin\theta \\ -\sin\theta & \frac{1}{2}\sin\theta + \frac{\sqrt{3}}{2}\cos\theta & \frac{1}{2}\sin\theta - \frac{\sqrt{3}}{2}\cos\theta \end{bmatrix} \begin{bmatrix} iu \\ iv \\ iw \end{bmatrix}$$

$$= \frac{2}{3} \begin{bmatrix} iu\cos\theta + iv\cos\left(\theta - \frac{2}{3}\pi\right) + iw\cos\left(\theta + \frac{2}{3}\pi\right) \\ -iu\sin\theta - iv\sin\left(\theta - \frac{2}{3}\pi\right) - iw\sin\left(\theta + \frac{2}{3}\pi\right) \end{bmatrix}$$

In [Expression 1], θ is the magnetic pole position of the motor 102. When a constant current amount Iconst is supplied to the V phase output assuming that the element in the V phase in FIG. 2 is evaluated, the following is obtained by substituting −Iconst/2, which is the current that returns to the U phase and W phase, in [Expression 1].

[MATH. 2]

[Expression 2]

$$\begin{bmatrix} Id \\ iq \end{bmatrix} = \frac{2}{3} Iconst \begin{bmatrix} -\frac{1}{2}\cos\theta + \cos\left(\theta - \frac{2}{3}\pi\right) - \frac{1}{2}\cos\left(\theta + \frac{2}{3}\pi\right) \\ \frac{1}{2}\sin\theta - \sin\left(\theta - \frac{2}{3}\pi\right) + \frac{1}{2}\sin\left(\theta + \frac{2}{3}\pi\right) \end{bmatrix}$$

Therefore, a desired current may be supplied to the V phase by setting the current command value (Id*, Iq*) in FIG. 6 based on [Expression 2]. A desired current may also be supplied to the U phase or the W phase by carrying out the similar calculation.

However, because the current is supplied also to the torque axis (q-axis) according to [Expression 2], there is a possibility that the motor will rotate to operate the moving body. Therefore, in the present invention, the brake circuit 107 shown in FIG. 1 is used to operate the brake device of the motor 102 or to confirm that the brake mechanism is in operation and, under the condition that the brake device is in operation, the command indicated by [Expression 2] is given to supply a desired current. This achieves the effect that a desired current may be supplied to the element of a desired phase while ensuring safety. Of course, the torque generated by the current given by [Expression 1] and [Expression 2] is within the range of the braking torque of the brake device 103.

Next, the following describes the current flowing in the chips in each phase in FIG. 2. The output current in the V phase can be controlled by [Expression 2]. However, for example, when current flow is set up so that the current flows from the inverter main circuit 101 to the motor 102, the current flows to the chip Tvp of the positive pole side switch part or to the chip Dwp of the negative pole side switch part/diode part. This is distributed according to the duty factor of the voltage command value given by the pulse width. In the first embodiment, because the motor 102 is locked by the brake device 103, the induced voltage is not generated in the motor. That is, the brake device 103 puts brake on the motor to make the amplitude of the command voltage extremely small with the result that the duty factor is almost 50%. That is, an effective current of Iconst/2 flows through the chip Tvp of the positive pole side switch part and the chip Dwp of the negative pole side switch part/diode part (strictly speaking, though the duty factor varies slightly according to the magnetic pole position θ, the effect on the lifetime estimation is very small).

Figure 7:
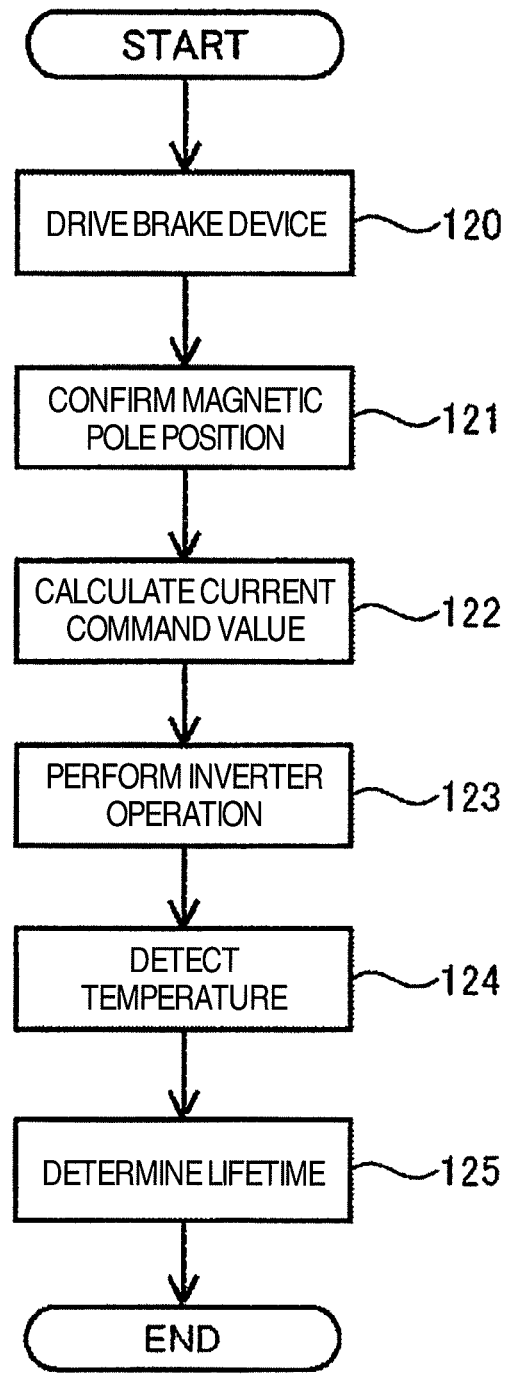
FIG. 7 is a flowchart showing lifetime evaluation in the first embodiment.

Next, the following describes a sequence of operation of lifetime evaluation with reference to the lifetime evaluation flowchart in the first embodiment shown in FIG. 7. First, after starting the operation, the brake device 103 is driven in step 120. In this step, the brake circuit 107 in FIG. 1 is used to surely drive the brake device or to confirm that the drive device is in operation. Next, in block 121, the magnetic pole position of the motor 102 is confirmed. The magnetic pole position can be detected by the rotary encoder 104 shown in FIG. 1. Next, in step 122, the current command value is calculated by carrying out calculation using [Expression 1] and [Expression 2] and, in step 123, the current is supplied to the corresponding phase. The phase, to which the current is supplied, is the V phase if the evaluation indicates that a crack in the upper solder layer 114a or a peeling of the metal conducting wire 115 is found, and is the phase in which the temperature detector 110a is mounted (W phase in the example in FIG. 2) if the evaluation indicates that a crack is detected in the lower solder layer 114b. Next, in step 124, the temperature detector 110a or temperature detector 110b is used to detect the temperature and, in step 125, the lifetime evaluation circuit 108 in FIG. 1 determines the lifetime.

Figure 8:
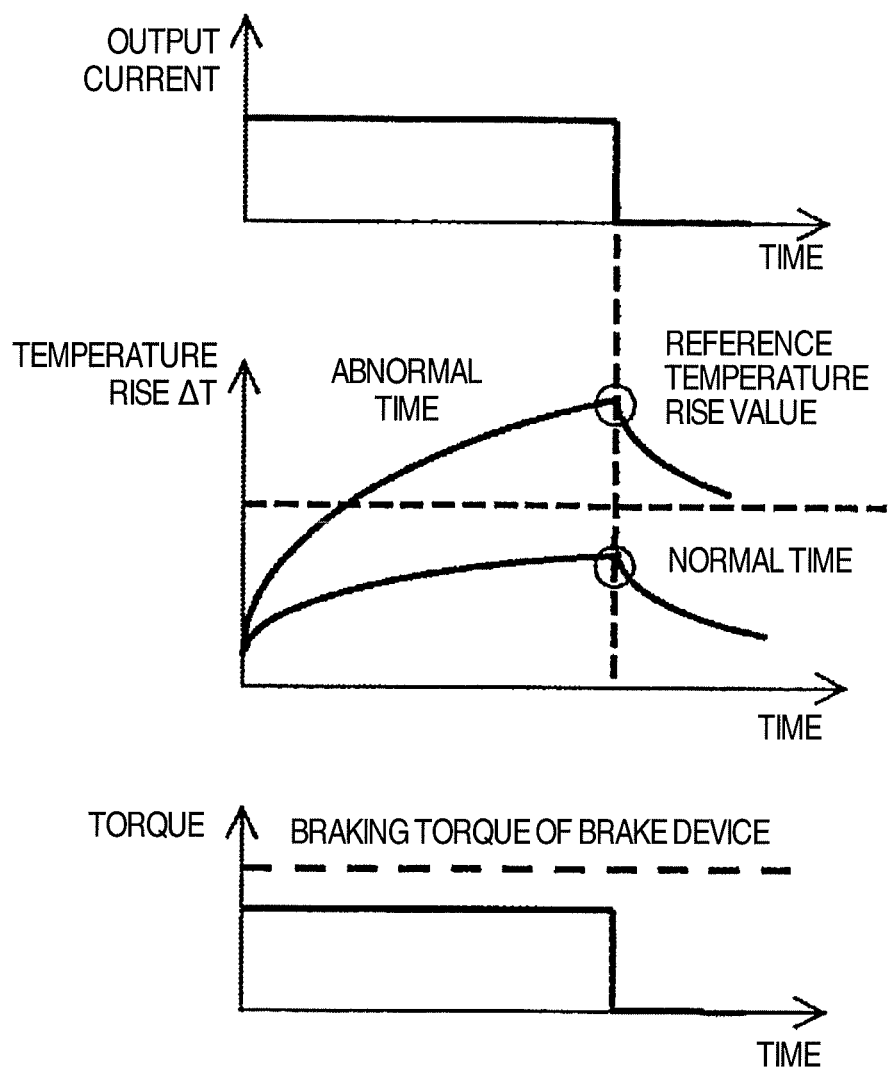
FIG. 8 is a diagram showing an example of lifetime determination in the first embodiment.

FIG. 8 shows an example of lifetime determination in the first embodiment. When a predetermined output phase current is supplied, the temperature increases according to the conduction interval. When an abnormal condition occurs, the radiation efficiency deteriorates as described above and therefore the temperature is much higher than at the normal time. The difference between the normal time and the abnormal time is larger as the amplitude of the output current is larger or as the conduction interval is longer. By setting the current amplitude as large as possible within the range in which the torque, generated by the command value, is equal to lower than the braking torque of the brake device as shown in FIG. 8, the evaluation time can be shortened. The lifetime evaluation circuit 108 in FIG. 1 determines that an abnormal condition is detected if the temperature or temperature rise becomes a temperature or temperature rise larger than at least a predetermined amount as compared with the history of the normal-time temperature or temperature rise value measured when a current of predetermined amplitude is given for a predetermined time. Alternatively, the lifetime evaluation circuit 108 determines that an abnormal condition is detected if the temperature or temperature rise value, detected by the temperature detector, exceeds a pre-set reference temperature or reference rise in temperature. If it is determined that an abnormal condition is detected, the abnormal indication signal is output and, as shown in FIG. 1, the abnormal state is displayed on the display device or the abnormal indication signal is issued to the management center. After that, the processing is performed, for example, by imposing limitations on the control circuit (for example, the output current is limited to a predetermined value or lower).

Although the six-in-one module in which the switching elements of all phases are mounted in one module, is described in the first embodiment, the similar method may be used for lifetime determination in one-in-one module or two-in-one module in which the switching elements are connected in parallel in one module.

In this case, because the chips in the center and the chips in the most outer periphery are in the same phase, the processing of the flowchart in FIG. 7 may be performed for the phases to be evaluated to perform the evaluation of a crack in the upper solder layer 114a and a peeling of the metal conducting wire 115 and the evaluation of a crack in the lower solder layer 114b at the same time. According to the present invention, lifetime determination may be made extremely accurately using a minimum of two temperature detectors per module.

Although the rotary encoder 104 is used to detect the magnetic pole position of the motor 102 in the first embodiment, the present invention may of course be applied, for example, to a system that does not use the rotary encoder 104 but uses the position sensor-less method in which the magnetic pole position is estimated from the motor current information using the saliency of the inductance of the motor 102.

Second Embodiment

Figure 9:
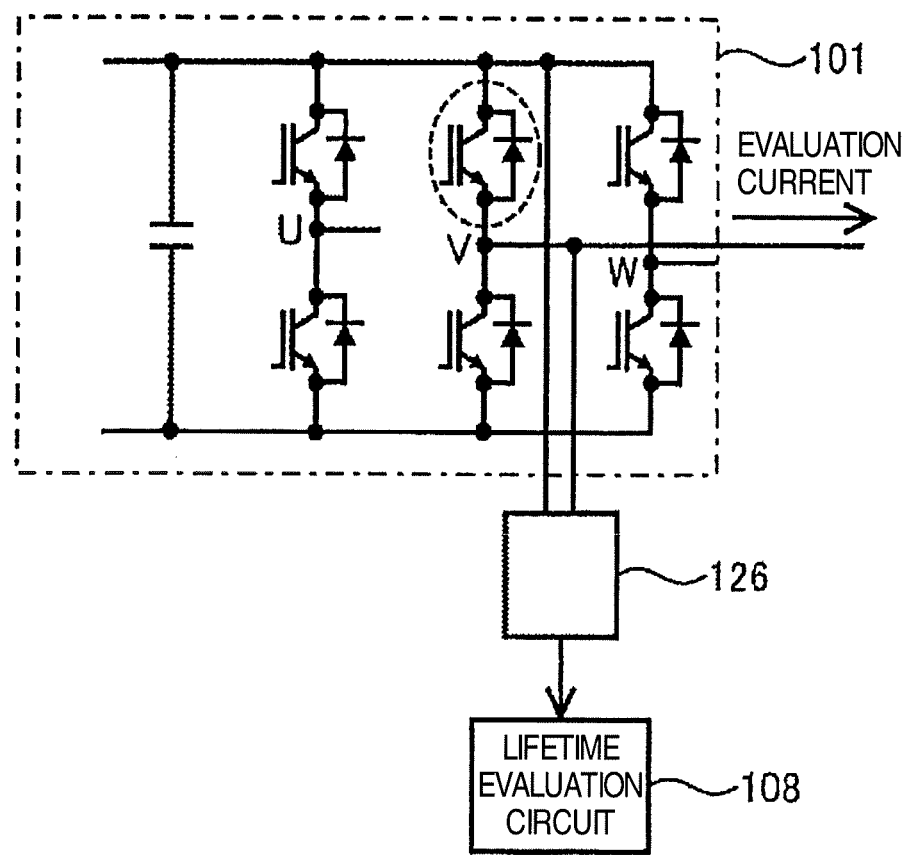
FIG. 9 is a configuration diagram showing a second embodiment of the present invention.
Figure 10:
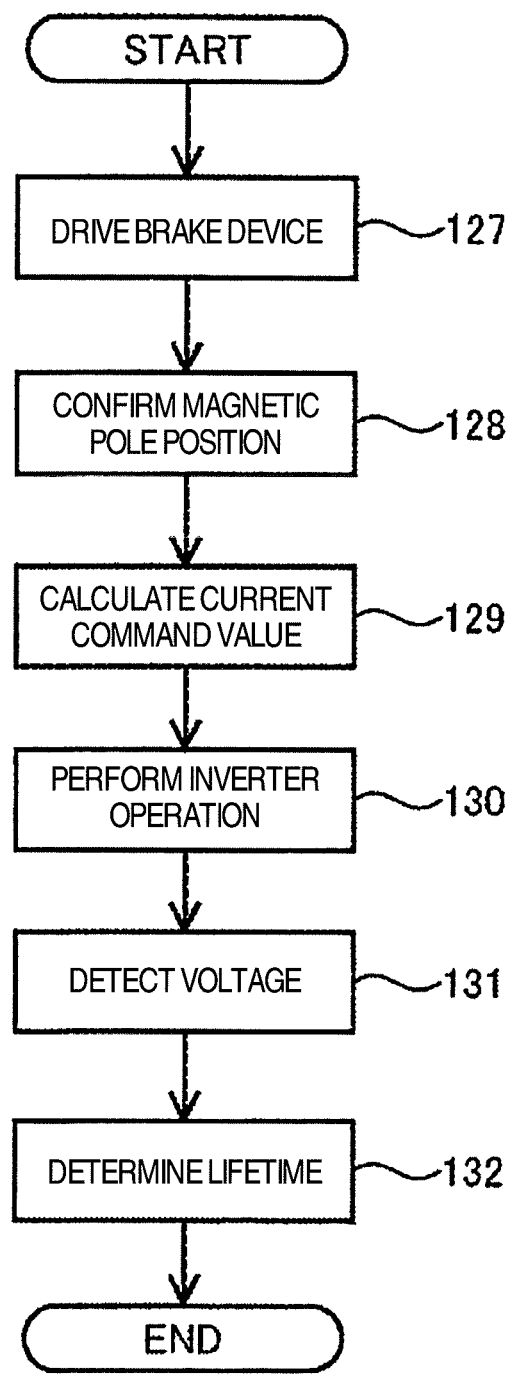
FIG. 10 is a flowchart showing lifetime evaluation in the second embodiment.

FIG. 9 is a diagram showing a power converter in a second embodiment of the present invention. This power converter has the configuration in which, in the inverter main circuit 101 in the first embodiment, a voltage detector 126, provided for detecting the collector-emitter voltage, is connected to a switching element to be measured (in FIG. 9, to the V-phase positive pole side switching element positioned in the center where the deteriorated is most conspicuous as indicated in the first embodiment). In the configuration of the second embodiment, the evaluation of a crack in the upper solder layer 114a and a peeling of the metal conducting wire 115 may be performed without using the temperature detector 110b used in the first embodiment. FIG. 10 is a flowchart showing the lifetime evaluation in the second embodiment. First, the brake device 103 is driven in block 127 as in the first embodiment shown in FIG. 7, and the magnetic pole position of the motor is confirmed in block 128. [Expression 1] and [Expression 2] are used to calculate the current command value. Note that the current command value given in the second embodiment is a square wave current as shown in the example of lifetime evaluation in the second embodiment shown in FIG. 11 (In FIG. 11, a small current is first supplied and, after supplying a pulse-shaped large current for a predetermined time, the current is switched to a small current). This can be implemented by temporally changing the value of Iconst in [Expression 1] and [Expression 2]. Next, in block 130, the inverter main circuit is activated to flow the above-described current command, and the voltage is detected by the voltage detector 126 in block 131. In this case, the detected voltage increases with the large current flowing as in FIG. 11. Next, in the lifetime determination block in block 132, the lifetime evaluation circuit 108 calculates the thermal resistance component from the difference $\Delta Vce$ in the detected voltage. That is, if a crack develops in the upper solder layer 114a or a peeling of the metal conducting wire 115 occurs, the thermal resistance component increases and the difference $\Delta Vce$ in voltage increases. The lifetime evaluation circuit 108 determines that an abnormal condition is detected if the thermal resistance becomes a thermal resistance value higher by at least a predetermined amount as compared with the history of thermal resistance value measured when a predetermined current is given for a predetermine time. Alternatively, the lifetime evaluation circuit 108 determines that an abnormal condition is detected if the calculated thermal resistance value exceeds a pre-set reference thermal resistance value. If it is determined that an abnormal condition is detected, the abnormal indication signal is output as in the first embodiment to display the abnormal state is displayed on the display device or the abnormal indication signal is issued to the management center. In addition, the processing is performed, for example, by imposing limitations on the control circuit. This invention achieves an effect that lifetime evaluation may be performed, not by using temperature detectors, but by detecting the voltage.

The lifetime evaluation in the first embodiment or the second embodiment is performed in the stopped state before a moving body is operated or after a predetermined operation is performed on the moving body. This prevents the operation of the moving body from being affected. It is also possible to perform the processing when a predetermined fixed time arrives (for example, a midnight time at which the moving body is not used) on a daily or weekly basis.

Figure 12:
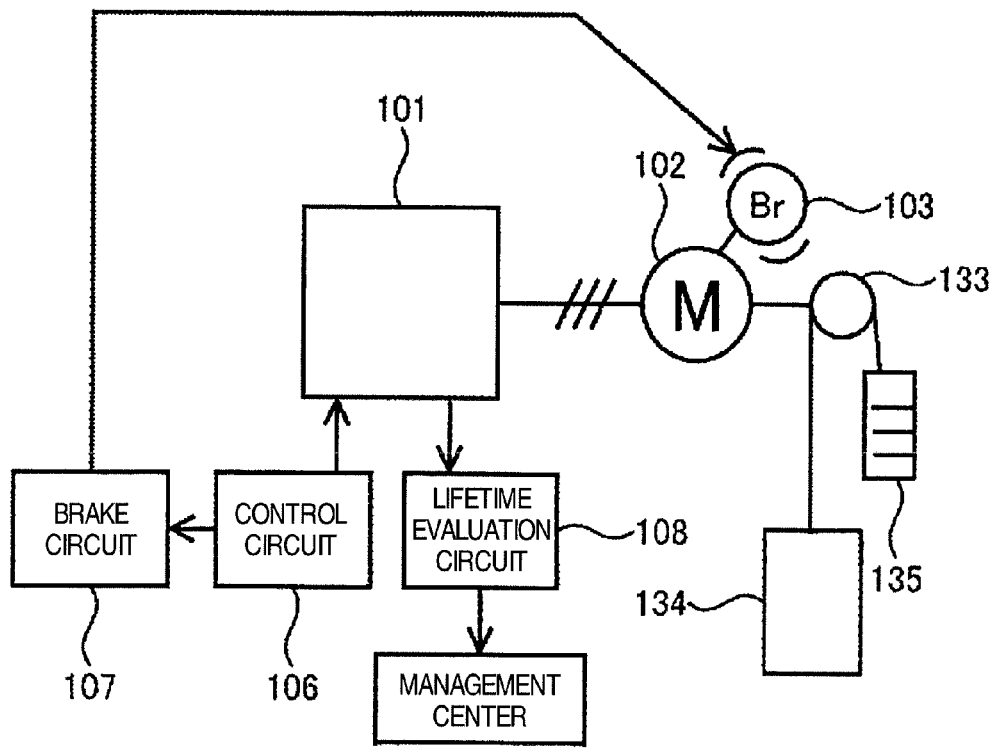
FIG. 12 is a diagram showing an example in which the first embodiment or the second embodiment is used in an elevator.

FIG. 12 is a diagram showing an example in which the first embodiment or the second embodiment is used in an elevator driving system. A sheave 133 is connected to the motor 102 to elevate a car 134 and a balance weight 135. In this case, the brake circuit 107 is used to confirm that the brake device 103 is in operation, and the control circuit 106 gives a command to supply a predetermine current to the inverter main circuit 101. In addition, the lifetime evaluation circuit 108 determines the lifetime of the elements in the inverter main circuit 101 and, if an abnormal condition is detected, issues the abnormal indication signal to the management center. Because the brake device 103 is in operation in the case shown in FIG. 12, the car 134 is not operated even if current is supplied to the inverter main circuit 101 for evaluation. In the case of an elevator, the lifetime evaluation processing may be performed in a time zone such as a midnight during which few users uses the elevator. The processing may also be performed as a remote diagnostic operation. In addition, the embodiment may be applied not only to an elevator but also to a system such as a crane.

Figure 13:
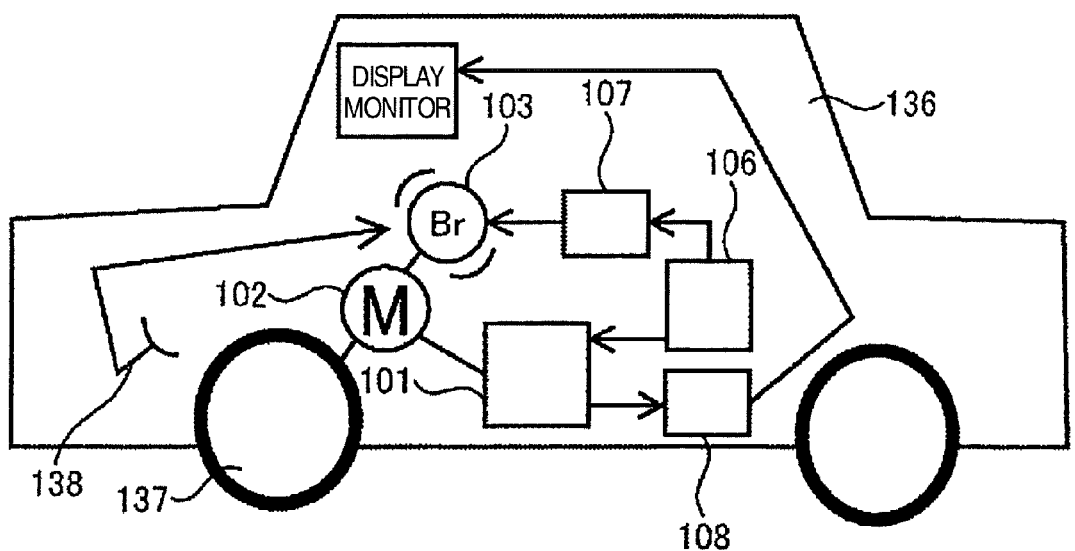
FIG. 13 is a diagram showing an example in which the first embodiment or the second embodiment is used in an electric vehicle.

FIG. 13 is a diagram showing an example in which the first embodiment or the second embodiment is used in an electric vehicle. An electric vehicle 136 has the configuration in which a power converter is used as the drive system and a tire 137 is connected to the motor 102. In this case, the brake circuit 107 is used to force the brake device 103 to operate or to confirm that the brake device 103 is in operation. The brake device in this case gives a braking torque in the same manner as a foot brake 138 does when operated. And, on the premise that brake device 103 is in operation, the control circuit 106 gives a command to supply a predetermined current to the inverter main circuit 101. In addition, the lifetime evaluation circuit 108 determines the lifetime of the elements in the inverter main circuit 101. If an abnormal condition is detected, it is possible to cause the display monitor to display a message to prompt the user to make repairs, to issue the abnormal indication signal wirelessly to the management center of the electric vehicle, or to perform operation with limitations imposed on the control circuit. Because the brake device 103 is in operation also in FIG. 13, the electric vehicle 136 does not operate even if current is supplied to the inverter main circuit 101 for evaluation. In the case of the electric vehicle 136, evaluation may also be performed before the operation. Although an example of an electric vehicle is shown in FIG. 13, the present invention may of course be applied to a hybrid vehicle, a cart, or an electric construction machine.

While the embodiments of the present invention have been described, it is to be understood that the present invention is not limited to the embodiments above and that further modifications may be made without departing from the spirit of the present invention.

INDUSTRIAL APPLICABILITY

The present invention is applicable to a general power converter for industrial use and, more particularly, to a power converter that drives the motor of a moving body.

REFERENCE SIGNS LIST

101 Inverter main circuit
102 Motor
103 Brake device
104 Rotary encoder
105 Current detector
106 Control circuit
107 Brake circuit
108 Lifetime evaluation circuit
109 Element module
109UP U-phase positive pole side switching element
110a, 110b Temperature detector
111a, 111b Metal pattern
112a, 112b Insulating substrate
113 Metal base plate
114a Upper solder layer
114b Lower solder layer
115 Metal conducting wire
126 Voltage detector
133 Sheave
134 Car
135 Balance weight
136 Electric vehicle
137 Tire
138 Foot brake

The invention claimed is:

1. A power converter comprising an inverter main circuit; a motor driven by the inverter main circuit; a brake device that puts brake on the motor; a control circuit that calculates a command value for driving said inverter main circuit; a mechanism that causes said brake device to operate or confirms that said brake device is in operation; and a temperature detector that detects a temperature of a switching element mounted in said inverter main circuit wherein
with said brake device in operation, a command for supplying a predetermined current to a particular phase is given from said control circuit to said inverter main circuit, a current is supplied from said inverter main circuit to said motor, and a lifetime of said switching element is evaluated based on temperature information detected by said temperature detector.

2. The power converter according to claim 1 wherein
the predetermined current supplied to a particular phase with said brake device in operation is a current in which a field system current component and a torque current component are mixed and wherein a torque generated by said motor using the mixed current is smaller than a braking torque of said brake device.

3. The power converter according to claim 2 wherein
said temperature detector is composed of two chips, one is a chip in the center and the other is a chip on an outermost periphery, in modules configuring said inverter main circuit.

4. The power converter according to claim 3 wherein
an element module configuring said inverter main circuit is a six-in-one mode module in which all switching elements of three phases of the inverter are mounted and wherein an operation of said power converter is controlled so that almost equal losses are generated in the phases in a steady state.

5. The power converter according claim 4 wherein
if a detected temperature value or temperature rise value becomes larger by at least a predetermined amount as compared with normal-time history or exceeds a predefined reference temperature value or reference temperature rise value, information is displayed on a display device or notified to a management center.

6. The power converter according to claim 3 wherein
if a detected temperature value or temperature rise value becomes larger by at least a predetermined amount as compared with normal-time history or exceeds a predefined reference temperature value or reference temperature rise value, information is displayed on a display device or notified to a management center.

7. The power converter according to claim 3 wherein
if a detected temperature value or temperature rise value becomes larger by at least a predetermined amount as compared with normal-time history or exceeds a predefined reference temperature value or reference temperature rise value, an output power of the inverter main circuit is limited.

8. The power converter according to claim 2 wherein
the phase to which the predetermined current is supplied is a phase that includes a chip where said temperature detector detects temperature and wherein an amount of the predetermined current is a constant value for all phases.

9. The power converter according to claim 8 wherein
if a detected temperature value or temperature rise value becomes larger by at least a predetermined amount as compared with normal-time history or exceeds a predefined reference temperature value or reference temperature rise value, information is displayed on a display device or notified to a management center.

10. The power converter according to claim 2 wherein
if a detected temperature value or temperature rise value becomes larger by at least a predetermined amount as compared with normal-time history or exceeds a predefined reference temperature value or reference temperature rise value, information is displayed on a display device or notified to a management center.

11. The power converter according to claim 2 wherein
if a detected temperature value or temperature rise value becomes larger by at least a predetermined amount as compared with normal-time history or exceeds a predefined reference temperature value or reference temperature rise value, an output power of the inverter main circuit is limited.

12. The power converter according to claim 1 wherein
if a detected temperature value or temperature rise value becomes larger by at least a predetermined amount as compared with normal-time history or exceeds a predefined reference temperature value or reference temperature rise value, information is displayed on a display device or notified to a management center.

13. The power converter according to claim 1 wherein
if a detected temperature value or temperature rise value becomes larger by at least a predetermined amount as compared with normal-time history or exceeds a predefined reference temperature value or reference temperature rise value, an output power of the inverter main circuit is limited.

14. The power converter according to claim 1 wherein
a lifetime evaluation of said switching element is performed before a moving body is operated, or in a stopped state after a predetermined operation is performed, or at a predetermined time.

15. A power converter comprising an inverter main circuit; a motor driven by said inverter main circuit; a brake device that puts brake on the motor; a control circuit that calculates a command value for driving said inverter main circuit; a mechanism that causes said brake device to operate or confirms that said brake device is in operation; and a voltage detector provided between terminals of switching elements mounted in said inverter main circuit wherein
- with said brake device in operation, a command for supplying a predetermined current to a phase, to which said voltage detector is connected, is given from said control circuit to said inverter main circuit, a current is supplied from said inverter main circuit to said motor, and a lifetime of said switching element is evaluated based on voltage information detected by said voltage detector.

16. The power converter according to claim 15 wherein
- the predetermined current supplied to a particular phase with said brake device in operation is a current in which a field system current component and a torque current component are mixed and wherein a torque generated by said motor using the mixed current is smaller than a braking torque of said brake device.

17. The power converter according to claim 15 wherein
- the predetermined current supplied to a particular phase with said brake device in operation is a current in which a field system current component and a torque current component are mixed and wherein a torque generated by said motor using the mixed current is smaller than a braking torque of said brake device.

18. The power converter according to claim 15 wherein
- a thermal resistance value is calculated using a voltage detected by said voltage detector and, if the calculated thermal resistance value becomes larger by at least a predetermined amount as compared with normal-time history or exceeds a predefined reference thermal resistance value, information is displayed on a display device or notified to a management center.

19. The power converter according to claim 15 wherein
- a thermal resistance value is calculated using a voltage detected by said voltage detector and, if the calculated thermal resistance value becomes larger by at least a predetermined amount as compared with normal-time history or exceeds a predefined reference thermal resistance value, an output power of the inverter main circuit is limited.

20. The power converter according to claim 15 wherein
- a lifetime evaluation of said switching element is performed before a moving body is operated, or in a stopped state after a predetermined operation is performed, or at a predetermined time.

* * * * *